United States Patent [19]
Lee et al.

[11] Patent Number: 6,063,187
[45] Date of Patent: May 16, 2000

[54] DEPOSITION METHOD FOR HETEROEPITAXIAL DIAMOND

[75] Inventors: Shuit Tong Lee; Chun Sing Lee; Yat Wah Lam, all of Hong Kong, The Hong Kong Special Administrative Region of the People's Republic of China; Zhangda Lin, Beijing, China

[73] Assignee: City University of Hong Kong, Hong Kong, The Hong Kong Special Administrative Region of the People's Republic of China

[21] Appl. No.: 08/910,746

[22] Filed: Aug. 13, 1997

[51] Int. Cl.[7] ..................................... C30B 29/04
[52] U.S. Cl. ........................ 117/101; 117/104; 117/929; 423/446; 204/173; 427/450; 427/577
[58] Field of Search .................... 117/101, 104, 117/929; 427/577, 450; 423/446; 204/173

[56] References Cited

U.S. PATENT DOCUMENTS

| | | | |
|---|---|---|---|
| 5,270,029 | 12/1993 | Yamaaki | 117/929 |
| 5,298,286 | 3/1994 | Yang et al. | 423/446 |
| 5,487,945 | 1/1996 | Yang et al. | 428/408 |
| 5,628,824 | 5/1997 | Vohra et al. | 117/929 |
| 5,744,825 | 4/1998 | Zazhai et al. | 257/77 |

OTHER PUBLICATIONS

Chang, J.J. et al, "Effects of oxygen and pressure on diamond synthesis in a magneto–active microwave discharge", J. Appl. Phys. 71 (6), Mar. 15, 1992, pp. 2918–2823.

Eddy, C.R., Jr. et al, "Deposition of diamond onto aluminum by electron cyclotron resonance microwave plasma–assisted CVD", J. Mater. Res., vol. 7, No. 12, Dec. 1992, pp. 3255–3259.

Gilbert, Donald R. et al, "Deposition of Diamond Using an Electron Cyclotron Resonance Plasma System", Mat. Res. Soc. Symp. Proc. vol. 339, pp. 301–306.

Jiang, X. et al, "Diamond epitaxy on (001) silicon: An interface investigation", Appl. Phys. Lett. 67 (9), Aug. 28, 1995, pp. 1197–1199.

Jiang, X. et al, "Heteroepitaxial diamond growth on (100) silicon", Diamond and Related Materials, 2 (1993), pp. 1112–1113.

Jiang, X. et al, "(7) Studies of Heteroepitaxial Nucleation and Growth of Diamond on Silicon", Electrochemical Society Proceedings vol. 95–4, pp. 50–60.

Jin, S. et al, "Electrical conductivity studies of diamond films prepared by electron cyclotron resonance microwave plasma", Appl. Phys. Lett. 63 (17), Oct. 25, 1993, pp. 2354–2356.

Lee, S.T. et al, "Pressure effect on diamond nucleation in a hot–filament CVD system", 1997 The American Physical Society, Physical Review B, vol. 55, No. 23, Jun. 15, 1997–I, pp. 937–941.

Mantei, T.D. et al, "Diamond deposition in a permanent magnet microwave electron cyclotron resonance discharge", J. Vac.Sci. Technol. A10(4), Jul./Aug. 1992, pp. 1423–1424.

(List continued on next page.)

*Primary Examiner*—Robert Kunemund
*Attorney, Agent, or Firm*—Burns, Doane, Swecker & Mathis, L.L.P.

[57] ABSTRACT

A method for the growth of diamond on a substrate combines an ECR (Electron cyclotron resonance) MPCVD (Microwave plasma chemical vapor deposition) method with a MPCVD method in one system. A two-step diamond growing method comprises firstly etching and nucleation performed by the ECR method and then diamond grown by the microwave plasma CVD method. Not only are high quality continuous polycrystalline diamond films on silicon wafer obtained but also heteroepitaxial growth has been achieved in the present invention. Auger electron spectroscopy (AES), scanning electron microscopy (SEM) and Raman spectroscopy have been used to characterize the structure and morphology of the synthesized diamond films.

18 Claims, 14 Drawing Sheets

OTHER PUBLICATIONS

McGinnis, Sean P. et al, "Evidence of an energetic ion bombardment mechanism for bias–enhanced nucleation of diamond", Appl. Phys. Lett. 66 (23), Jun. 5, 1995, pp. 3117–3119.

Pan, L.S. et al, "Diamond: Electronic properties and applications", Kluwer Academic publishers, pp. 80–81.

Singh, R. K. et al, "Low–pressure, low–temperature, and remote–plasma deposition of diamond thin films from water–methanol mixtures", Appl. Phys. Lett. 61 (24), 14 Dec. 1992, pp., 2863–2865.

Stoner, B.R. et al, "Textured diamond growth on (100) $\beta$–SiC via Microwave plasma chemical vapor deposition", Appl. Phys. Lett. 60 (6), Feb. 10, 1992, pp. 698–700.

Wolter, S.D. et al, "Textured growth of diamond on silicon via in situ carburization and bias–enhanced nucleation", Appl. Phys. Lett., 62 (11), Mar. 15, 1993, pp. 1215–1217.

Yang, Jie et al, "Structural study of diamond film formed on silicon wafer by hot–filament chemical vapor deposition method", Appl. Phys. Lett. 65 (25), Dec. 19, 1994, pp. 3203–3205.

Jeon et al. "Large–area diamond nucleation on Si substrate by ECR plasma CVD", Diamond Film Technology vol. 6(3) pp. 157–164, 1996.

DEPOSITION METHOD FOR HETEROEPITAXIAL DIAMOND

FIELD OF THE INVENTION

The present invention relates to diamond growth and in particular to a method of nucleating and growing high quality heteroepitaxial diamond thin films.

BACKGROUND OF THE INVENTION

There is currently interest in the applications of diamond thin films for many different industrial fields. The primary reason is that diamond possesses many unique and superior properties which are unrivaled by other materials. These properties include high thermal conductivity, highly electrical insulating, extremely high hardness and a large refractive index. Diamond also has very low etching or corrosion rates by oxygen and under other harsh chemical conditions. Its potential for electronic applications has also been made clear (R. F. Davis and J. T. Glass, *Advances in Solid-State Chemistry*, JAI, London, 1991, vol.2). There is therefore a large demand for low-cost, high quality synthetic diamond. The lack of low-cost, high quality diamond has severely impeded the progress of applying the remarkable physical properties of diamond in electronic devices.

The recent development of diamond synthesis by low-pressure chemical vapor deposition (CVD) has given rejuvenated hopes for diamond applications. However, the realization of large-scale applications of diamond for electronics devices has been greatly hampered by the polycrystalline nature and surface roughness of CVD diamond. High quality synthetic diamond via homoepitaxial growth on single crystal diamond has been reported. Unfortunately, this approach to growing high quality diamond is economically impractical, as a low-cost single crystal diamond substrate of sufficient size is not readily available. Therefore, heteroepitaxial growth of diamond on a low-cost, readily available foreign substrate is a more viable approach and has been an important goal of the diamond researchers. As silicon is the most important material for the present microelectronics industry, diamond heteroepitaxy on silicon wafer has thus received much attention. However, the large lattice mismatch and the large difference in surface energy between silicon and diamond (lattice parameter of Si is 0.543 nm and surface energy of Si (111) plane is 1.5 $Jm^{-2}$; while lattice parameter and surface energy of diamond are respectively 0.356 nm and 6 $Jm^{-2}$) have raised considerable controversy about the feasibility of heteroepitaxial diamond growth on silicon substrates.

Recently, important advances towards heteroepitaxy of CVD diamond have been reported. By applying a negative bias voltage to the substrate during the nucleation stage in a MPCVD process, Stoner et al. (B. R. Stoner and J. T. Class, *Appl. Phys. Lett. Appl. Phys. Lett.*, 60, 698, 1992; S. D. Wolter, B. R. Stoner, J. T. Glass, P. J. Ellis, D. S. Buhaenko, C. E. Henkins, and P. Southworth, *Appl. Phys. Lett.* 62, 1215, 1993) and Jiang et al. (X. Jiang and C. P. Klages, *Diamond & Relat. Mater.*, 1, 195, 1992) obtained highly oriented diamond films on SiC and Si substrates. Substrate bias during CVD growth has now been established as an effective means for enhanced and oriented diamond nucleation. Although the mechanism of bias-enhanced epitaxial nucleation is still not well understood, experimental results have shown the important role of ion bombardment (X. Jiang, M. Paul, C. -P. Klages, and C. L. Jia, *in Diamond Materials* IV, 1995 Vol. 95-4, p. 50, S. McGinnes, M. Kelly, and S. B. Hagstrom, *Appl. Phys. Lett.* 66, 3117, 1995).

Further, cross-sectional TEM study of the diamond films thus grown showed that local diamond heteroepitaxy grew directly on silicon without any interlayer (Jie Yang, Zhangda Lin, Li-Xin Wang, Sing Jin, and Zhe Zhang, *Appl. Phys. Lett.* 65, 3203, 1994; X. Jiang and C. L. Jia, *Appl. Phys. Lett.* 67, 1197, 1995). The result implies that a homogeneously clean silicon surface may be required for growing large-area diamond heteroepitaxy; a situation similar to molecular beam epitaxy.

Another relevant development concerning heteroepitaxial diamond nucleation is the present inventors recent results on the enhanced nucleation at low reactant gas pressure during CVD diamond growth (S. T. Lee, Y. W. Lam, Z. Lin, Y. Chen and Q. J. Chen, *Phys. Rev. B.*, B55, 24, 1997). It is interpreted that enhanced nucleation at low pressure is due to a longer mean free path which gives rise to reduced collisions and thus a larger amount of diamond precursors arriving at the substrate. Further, at low pressure, the substrate surface is likely to remain cleaner, which is conducive to diamond heteroepitaxy.

In order to apply these important findings towards the production of large-area heteroepitaxial diamond films, two problems have to be addressed. The first one is on how to keep the chamber pressure low and still get enough ion bombardment. Another problem is that the ideal chamber pressure for nucleation is usually too low to allow for a high growth rate.

PRIOR ART

ECR-MPCVD has been used previously for diamond deposition, although none of the earlier attempts have obtained diamond heteroepitaxy. Chang and Mantei (T. D. Mantei and J. J. Chang, *J. Vac. Sci. Technol.*, A10, 1423, 1992; J. J. Chang and T. D. Mantei, *J. Appl. Phys*, 71, 2918, 1992) have reported characteristic diamond Raman spectra from films grown in their ECR system. However, the filament nominally used for heating the front side of the wafer in their reactor was maintained under conditions similar to those used for hot filament growth of high quality diamond films. While many papers have declared they have obtained diamond films by ECR-MPCVD method (S. Jin and T. D. Moustakas, *Appl. Phys. Lett.* 63, 2354, 1993; R. K. Singh et al., *Appl. Phys. Lett*, 61, 2863, 1992; C. R. Eddy et al., *J. Mater. Res.*, 7, 3255, 1992;D. R. Gribert et al, *Diamond, SiC and Nitride wide bandgap semiconductors, Mater. Res. Soc.*, p.301, 1994); Pan and Kania (L. S. Pan and D. R. Kania, *Diamond: Electronic properties and applications*, Kluwer Academic publishers, p. 80–81, 1994) pointed out that no film reported to have been grown solely by this method has been shown by Raman spectroscopy to be predominantly $sp^3$ bonded. The reason for this controversy is that in the works reporting diamond growth by ECR method, the working pressure is from 60 mTorr to 200 mTorr which is significantly higher than the maximum pressure (–10 mTorr) at which ECR can still occur. Thus, barring a breakthrough in fully exploring the benefit of diamond growth under true ECR condition, the films grown are still by no means heteroepitaxy.

In fact, the major problem of an ECR-MPCVD process is that at the pressure required to establish an ECR effect, ion densities are too low to allow a sufficient growth rate. In short, while ECR-MPCVD is a good pretreatment and nucleation method, it is certainly not a good method for growing diamond thin films.

SUMMARY OF THE INVENTION

The object of the present invention to provide a two-step diamond growth method based on ECR-MPCVD method.

According to the present invention therefore there is provided a method of growing a diamond film on a silicon substrate, comprising: (a) etching said substrate, (b) nucleating said substrate by means of an ECR-MP process at a first pressure, and (c) depositing a diamond film by means of a MPCVD process at a second pressure, wherein steps (b) and (c) are carried out in a common deposition chamber without breaking the vacuum between steps (b) and (c).

The first step involves etching followed by nucleation on silicon substrates by an ECR microwave plasma at a low pressure (about 5 mTorr). This is followed by a growth process during which the chamber pressure is raised to about 50 Torr and the magnetic field that generates the ECR effect is turned off (i.e. typical MPCVD condition). In the deposition system pumped by a turbomolecular pump, the chamber pressure can be switched between the low (1 to 10 mTorr) and the high (1 Torr to 1 atm) pressure range without breaking the vacuum. With this system, substrate of large area can be cleaned, etched and nucleated uniformly in the same reaction chamber with the ECR microwave plasma. Furthermore, the ECR effect can provide a high density of ion bombardment under a low working pressure. These factors are beneficial to the formation of heteroepitaxial nuclei. Diamond films are then grown on these nuclei at a high rate under conventional MPCVD condition.

In the present method, the ECR-MP process is used to address some of the major problems found in CVD nucleation of diamond films on hetero-substrates: small deposition area and poor film uniformity. Due to its low pressure and high ion density environment, the ECR process also enhances the heteroepitaxial nucleation of diamond. On the other hand, the common MPCVD method is used to provide a high growth rate of high quality diamond on the heteroepitaxial nuclei obtained in the ECR nucleation step.

On the basis of solving the problem of pressure change scale, for the first time, we combined the ECR-MPCVD condition with the common MPCVD condition. These two different pressure conditions can change easily without breaking the vacuum condition in our microwave plasma system.

Not only continuous polycrystalline diamond films on silicon wafer have been obtained but significantly heteroepitaxial growth has also been achieved in present invention. Silicon wafers of 2 inch in diameter were used as substrates. Uniform and continuous diamond films were deposited on the silicon wafers. Advanced surface analysis methods have been used to characterize the synthesized films and interfaces between the diamond films and their substrates. The analysis results show that high quality diamond films have been obtained.

According to the persent invention there is further provided apparatus for pretreating a substrate for growth of a diamond film thereon, comprising: an evacuable chamber, a substrate holder positioned in said chamber, means for applying a bias voltage to said substrate holder, and means for generating a magnetic field suitable for an electron cyclotron resonance effect.

BRIEF DESCRIPTION OF THE DRAWING

Some examples of the present invention will now be described by way of example and with reference to the accompanying drawings, in which.

DETAILED DESCRIPTION OF AN EMBODIMENT OF THE INVENTION

The experimental conditions of the following examples of the present invention are summarised in table I.

TABLE I

|  | ECR-Nucleation | Growth |
| --- | --- | --- |
| Microwave power (W) | 400–1100 | 1000–1300 |
| Pressure (Pa) | 1–100 | 2000–5000 |
| $CH_4/H_2$ ratio | 2–50% | 1–4% |
| Substrate temperature (°C.) | 30–900 | 600–900 |
| Bias (V) | −30 to +30 | 0 |
| Time (Hr) | 0.2–5 | 1–24 |

Figure 1:
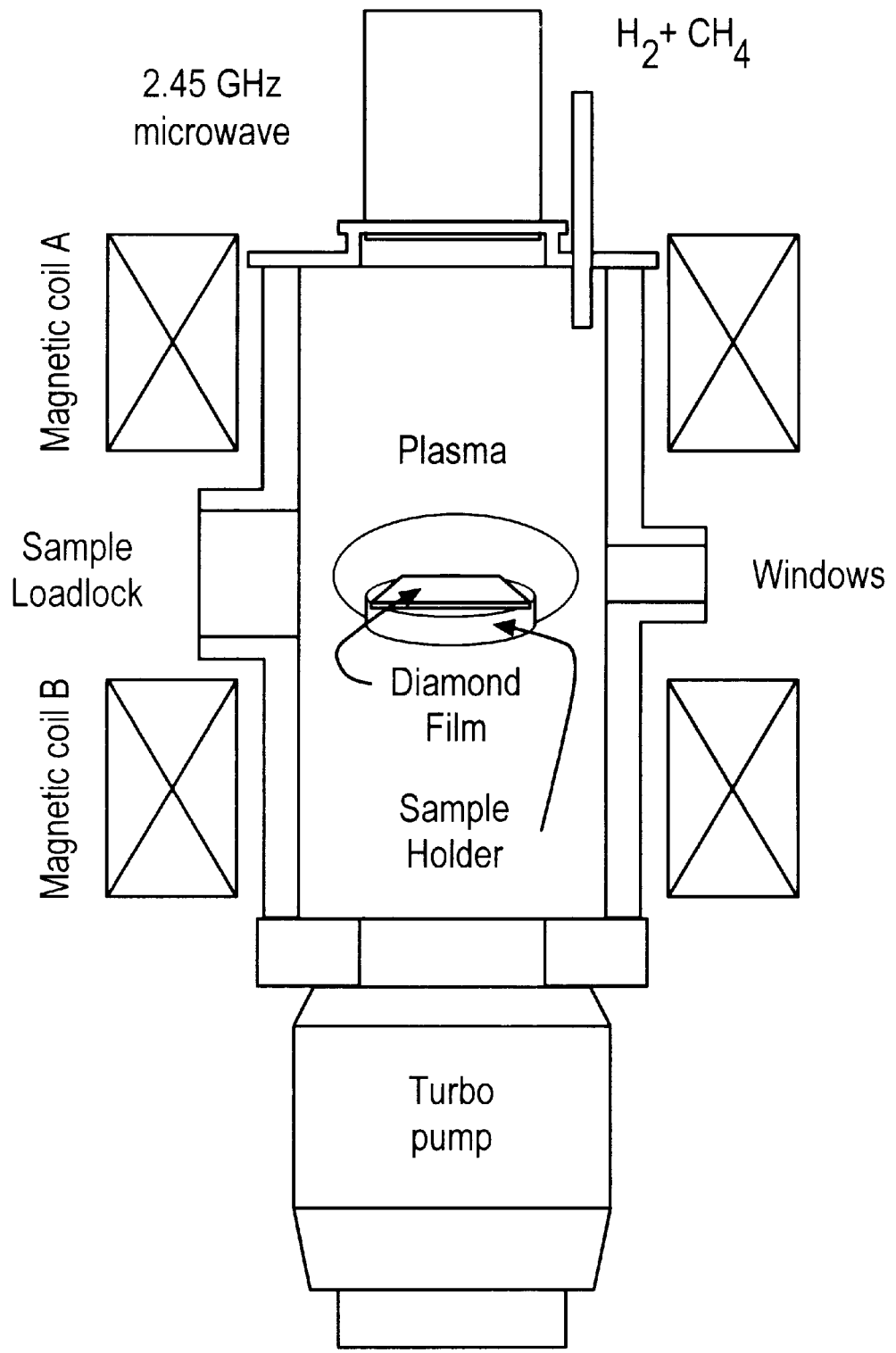
FIG. 1 is a schematic diagram of the ECR-MPCVD system used in the present invention.

A higher microwave power and a longer processing time are also possible. Although different materials have been used as substrates in our experiments, mirror-polished silicon wafers are used as a typical example. The sample was cleaned with a typical chemical cleaning process, which included washing by a cleaning solution, etching in diluted hydrofluoric acid for 20 seconds, cleaning with acetone, and washing with de-ionized water before loading into the ECR-MPCVD system. The base vacuum in the system is $7 \times 10^{-4}$ Pa obtained by using a turbomolecular pump. The system is shown in FIG. 1. Two electromagnets supply the magnetic field required for establishing the electron cyclotron resonance. The pressure under ECR working condition is lower than 10 mTorr. The duration of the ECR process is between 10 minutes to 6 hours according to different needs. The substrate temperature can be controlled from room temperature to 850° C. The substrate may be provided with a bias voltage.

EXAMPLE 1

ECR condition:

Microwave power: 450 W

Gas supply: $CH_4$, 7 sccm; $H_2$, 14 sccm.

Pressure: 1 Pa

Duration: 5 hours

Figure 2:
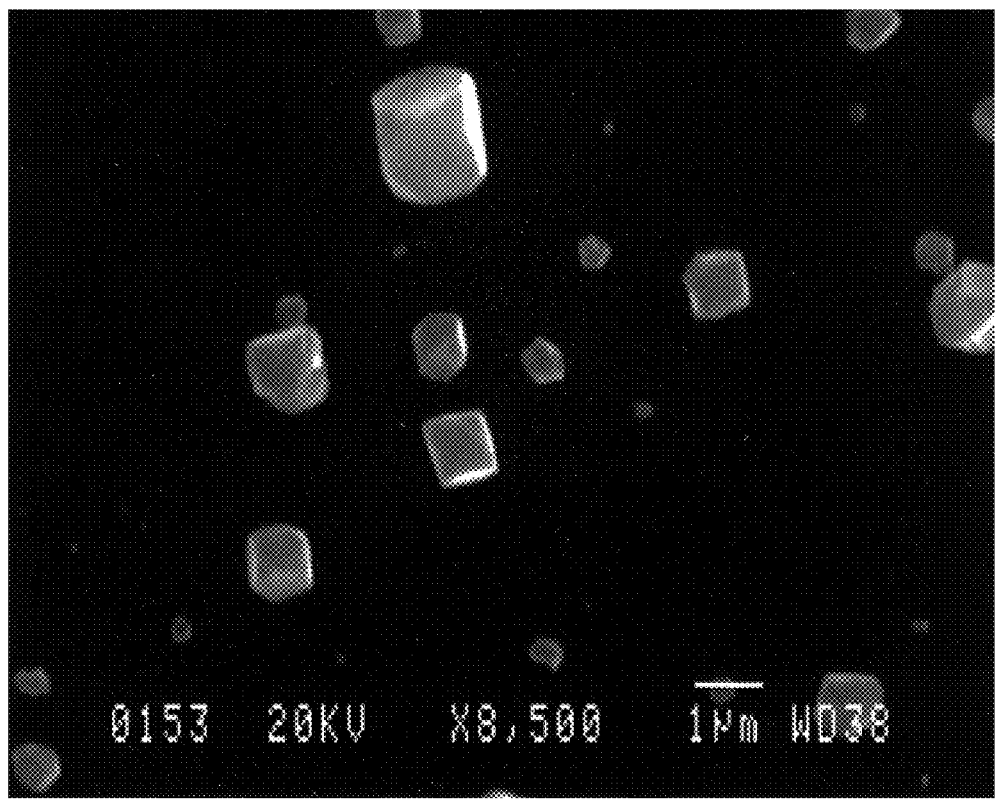
FIG. 2 is a scanning electron microscopy (SEM) micrograph showing diamond heteroepitaxial crystals grown on Si(100) wafer.

MPCVD growth condition:
  Microwave power: 1.3 kW
  Gas supply: $CH_4$, 1 sccm; $H_2$, 200 sccm.
  Pressure: 6650 Pa
  Duration: 6 hours A scanning electron microscopy (SEM) micrograph of heteroepitaxial diamond crystals grown on a Si(100) wafer is shown in FIG. 2. The source gas was a mixture of $CH_4$ and hydrogen. The substrate was 850° C.

EXAMPLE 2

Figure 3:
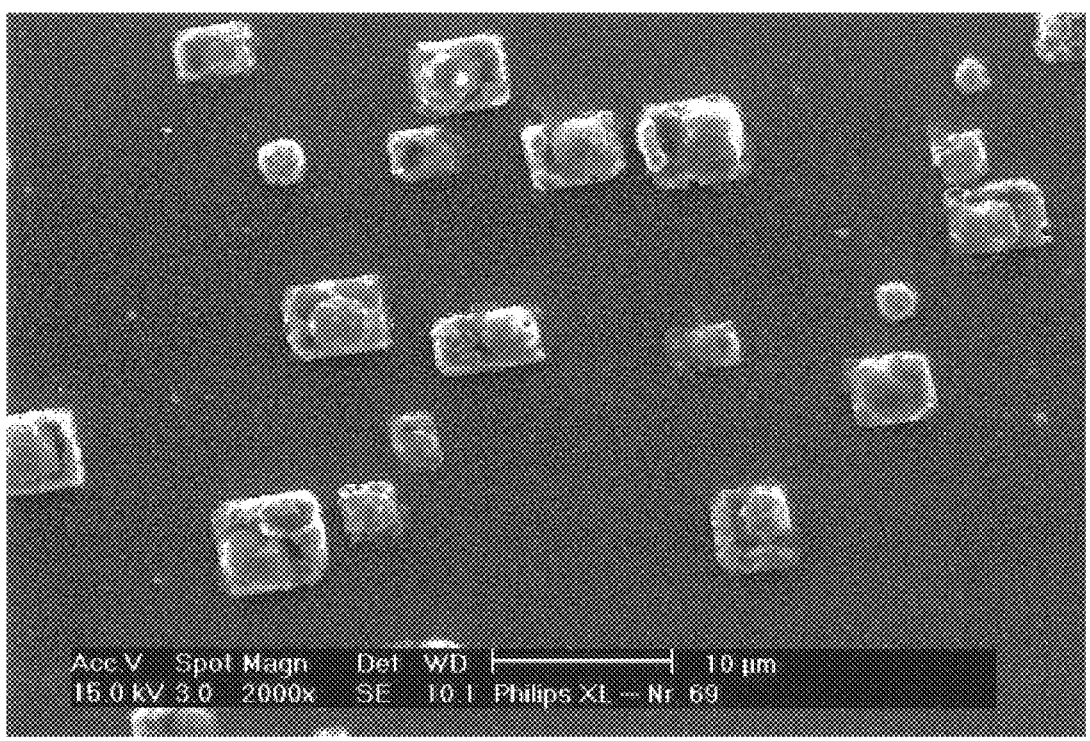
FIG. 3 is a SEM micrograph of the initial stage of the epitaxial diamond nuclei grown on Si(100) wafer.

ECR condition:
  Microwave power: 500 W
  Gas supply: $H_2$, 19 sccm, 1 hour; then CO, 6.5 sccm & $H_2$ 7 sccm 2 hours.
  Pressure: 1 Pa
  Duration: 3 hours
MPCVD growth condition:
  Microwave power: 1.3 kW
  Gas supply: $CH_4$, 1.2 sccm; $H_2$, 200 sccm.
  Pressure: 6650 Pa
  Duration: 3 hours FIG. 3 is a scanning electron microscopy (SEM) micrograph showing the initial stage of the epitaxial diamond nuclei on Si(100) wafer. The source gas was a mixture of CO and hydrogen. The substrate temperature was 850° C.

FIG. 2 and FIG. 3 show that with the ECR enhancing nucleation effects, diamonds crystals can be grown epitaxially on Si wafers by using either $CH_4$ or CO gases mixed with hydrogen.

EXAMPLE 3

Figure 4:
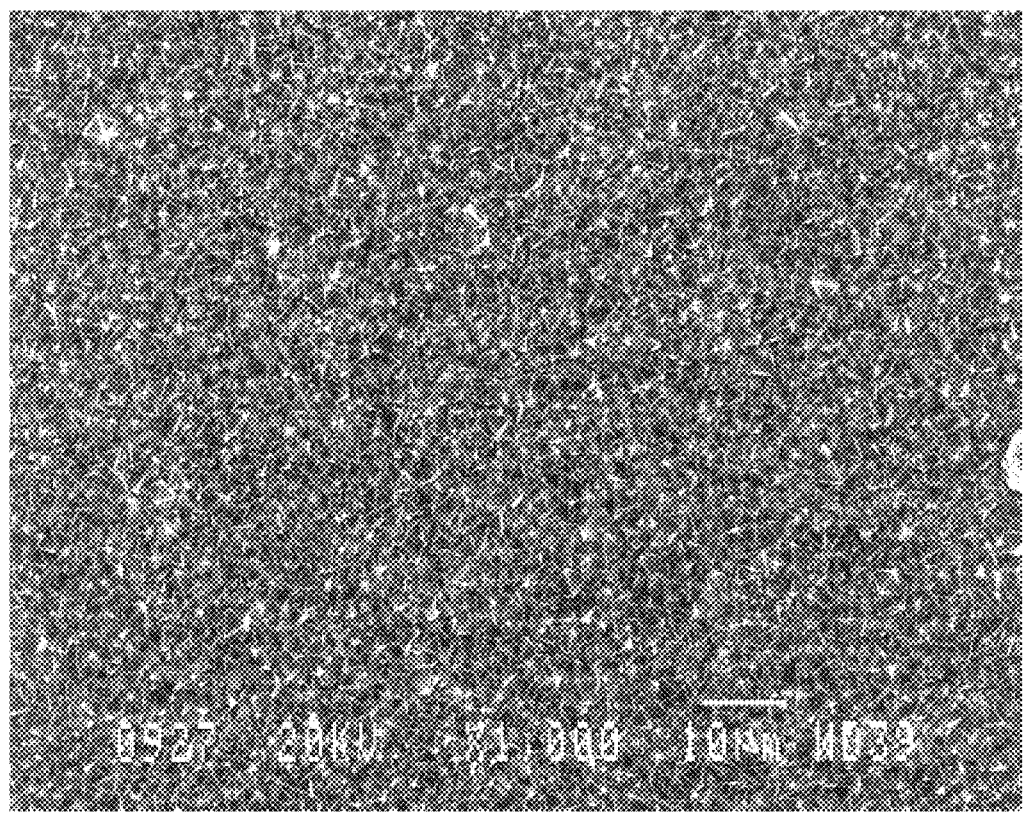
FIG. 4 is a SEM micrograph of a continuous polycrystalline diamond film grown on a Si wafer.
Figure 5:
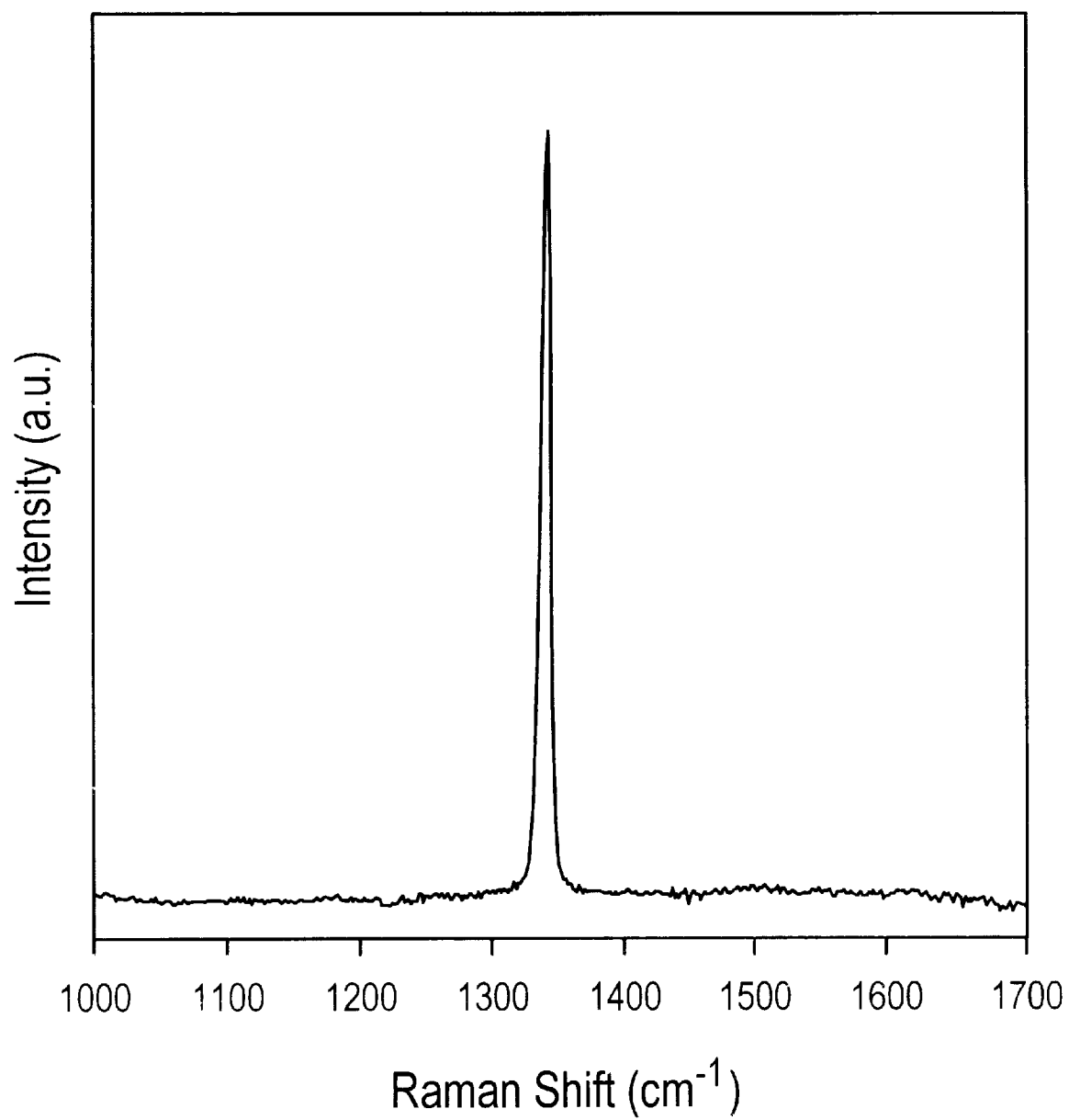
FIG. 5 is a Raman spectrum of the as-grown continuous diamond film.
Figure 6:
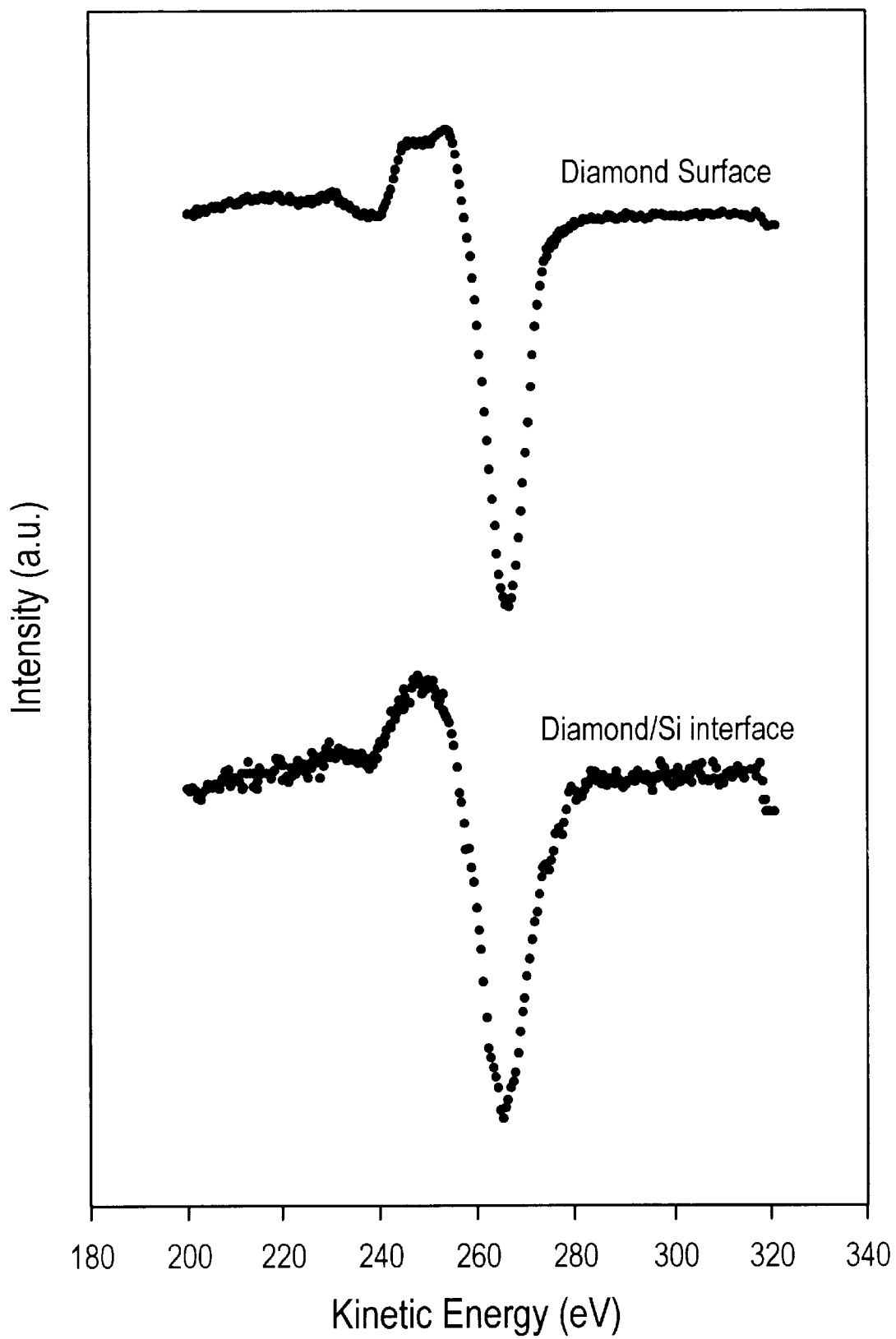
FIG. 6 shows the Auger spectra of the as-grown diamond film on Si wafer and that of the interface between diamond film and its Si substrate.

Continuous polycrystalline diamond films on Si wafer have also been grown by using other experimental parameters. FIG. 4 is a SEM micrograph of a continuous polycrystalline diamond film on Si wafer. The corresponding experimental parameters are as following:
ECR condition:
  Microwave power: 500 W
  Substrate temperature: 850° C.
  Gas supply: $H_2$, 19 sccm, 3 hour; then $CH_4$ 6.5 sccm; $H_2$ 7 sccm, 3 hours.
  Pressure: 1 Pa
  Duration: 6 hours
MPCVD growth condition:
  Microwave power: 1.3 kW
  Gas supply: $CH_4$, 1 sccm; $H_2$, 200 sccm.
  Substrate temperature: 830° C.
  Pressure: 6650 Pa
  Duration: 15 hours FIG. 5 and FIG. 6 show respectively the Raman and the Auger (AES) spectra of the continuous diamond film on Si. A sharp 1332 peak in FIG. 5 shows that a high quality diamond film has been obtained. Comparison of the AES spectra of diamond film surface and the interface between diamond film and Si substrate suggests that while the diamond surface gives very clear diamond signal; there are some amorphous carbon signal from the interface.

EXAMPLE 4

Figure 7:
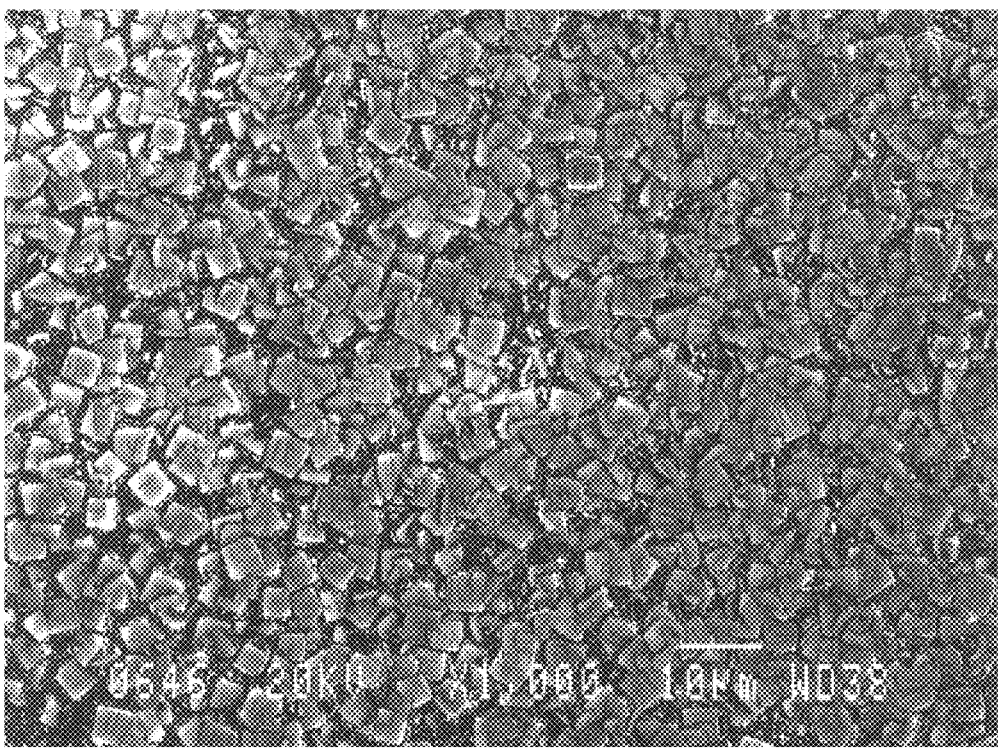
FIG. 7 is a SEM image of an oriented diamond film on (100) Si wafer.

FIG. 7 is a SEM micrograph of an oriented diamond film on Si wafer. The (100) faces of the diamond crystals are parallel to the (100) plane of the silicon substrate. The experimental parameters are as following:

ECR condition:
  Microwave power: 1100 W
  Gas supply: $H_2$, 80 sccm; $CH_4$, 8 sccm
  Pressure: <10 Pa
  Time: 5 hours
MPCVD growth condition:
  Microwave power: 1100 W
  Gas supply: $H_2$, 198 sccm; $CH_4$, 2.4 sccm
  Substrate temperature: 730° C.
  Pressure: 4000 Pa
  Duration: 15 hours

EXAMPLE 5

Figure 8:
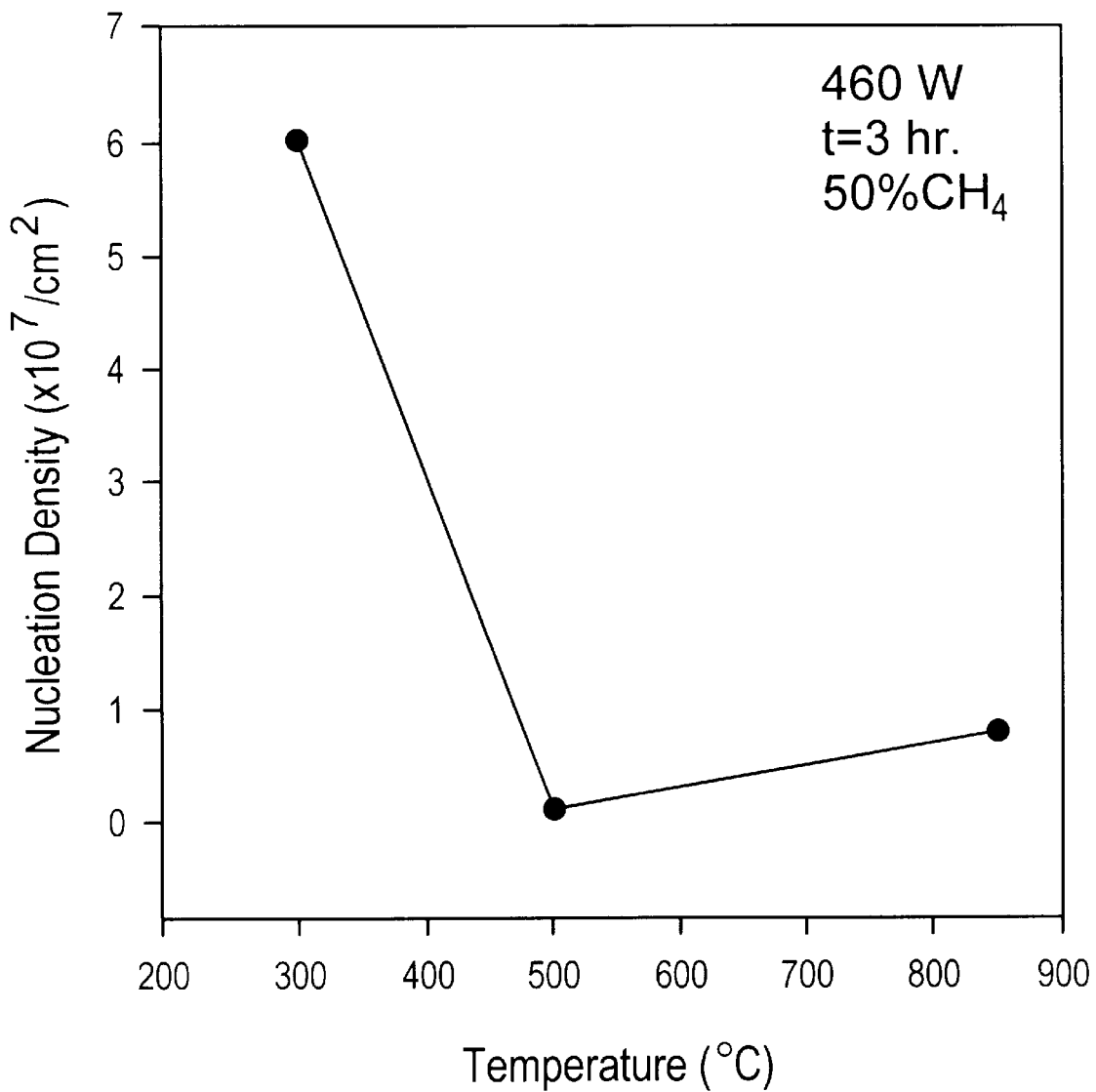
FIG. 8 is a graph of the nucleation density as a function of the substrate temperature during ECR treatment.

FIG. 8 shows how the nucleation densities are affected by the substrate temperature. At 300° C., amorphous carbon was deposited because the substrate temperature is lower. The nucleation density of diamond crystals increases from $1 \times 10^6$ to $7.7 \times 10^6$ /cm², when the substrate temperature changes from 500 to 850° C.
ECR condition:
  Microwave power: 460 W
  Gas supply: $H_2$, 19 sccm; 1 hour, then $H_2$, 8 sccm; $CH_4$, 8 sccm
  Pressure: 1 Pa
  Duration: 3–4 hours
MPCVD growth condition:
  Microwave power: 1.3 kW
  Gas supply: $H_2$ 200 sccm, $CH_4$ 1 sccm
  Pressure: 6650 Pa
  Duration: 14 hours

EXAMPLE 6

Figure 9:
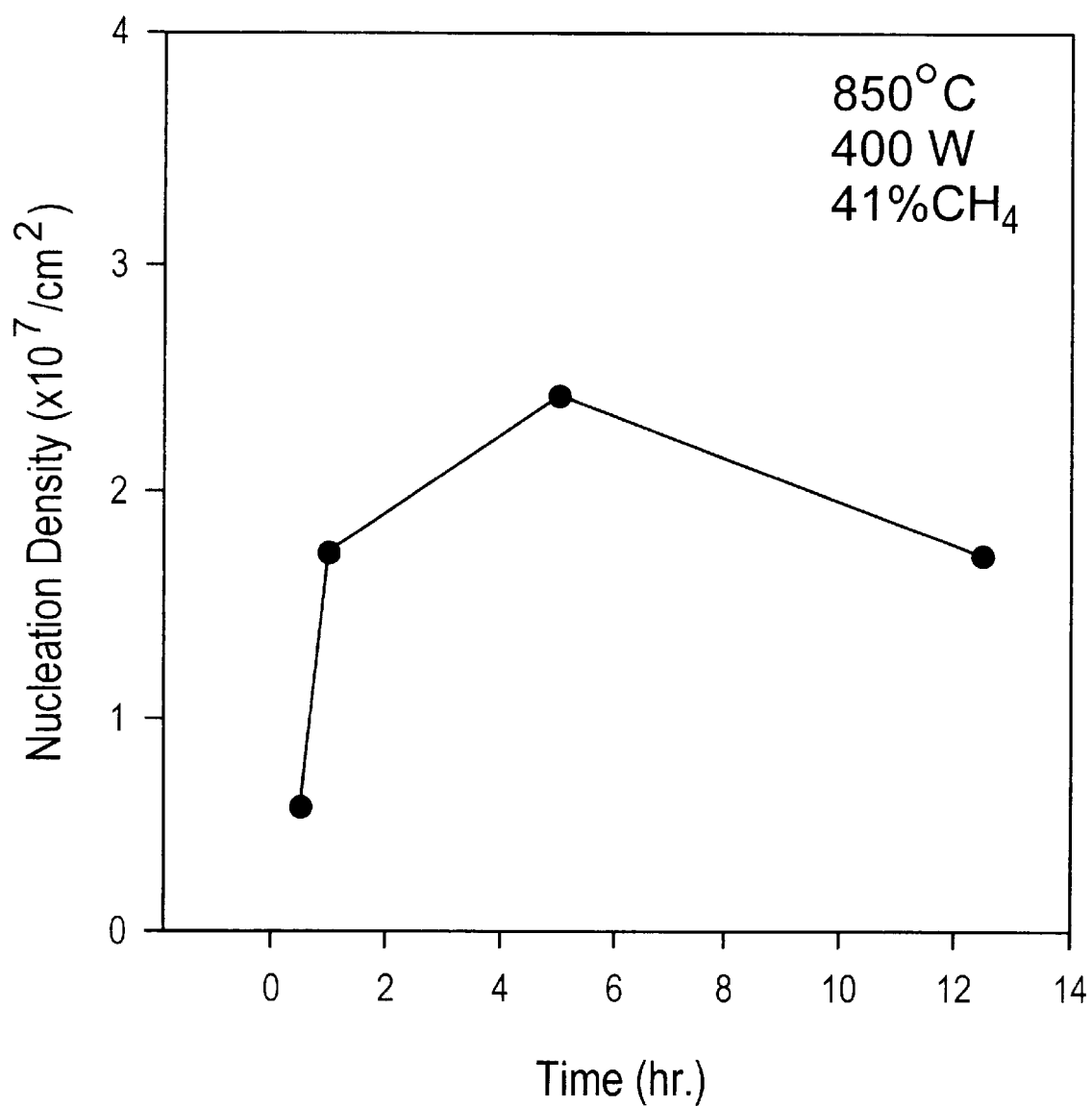
FIG. 9 is a graph of the nucleation density as a function of the duration of ECR treatment.

FIG. 9 shows how nucleation densities are influenced by the duration of ECR treatment. The density increases as time increases from 0.5 to 5 hours. However, the density no longer increases when the ECR treatment time is larger than 5 hours, this may be due to the sputtering effect.
ECR condition:
  Microwave power: 400 W
  Gas supply: $H_2$, 19 sccm, 1 hour; then $H_2$, 7 sccm; $CH_4$, 6.5 sccm
  Pressure: 1 Pa
  Duration: 0.5–12.5 hours
MPCVD growth condition:
  Microwave power: 1.3 kW
  Gas supply: $H_2$, 200 sccm; $CH_4$, 1–2 sccm
  Pressure: 6650 Pa
  Duration: 6–9 hours

EXAMPLE 7

Figure 10:
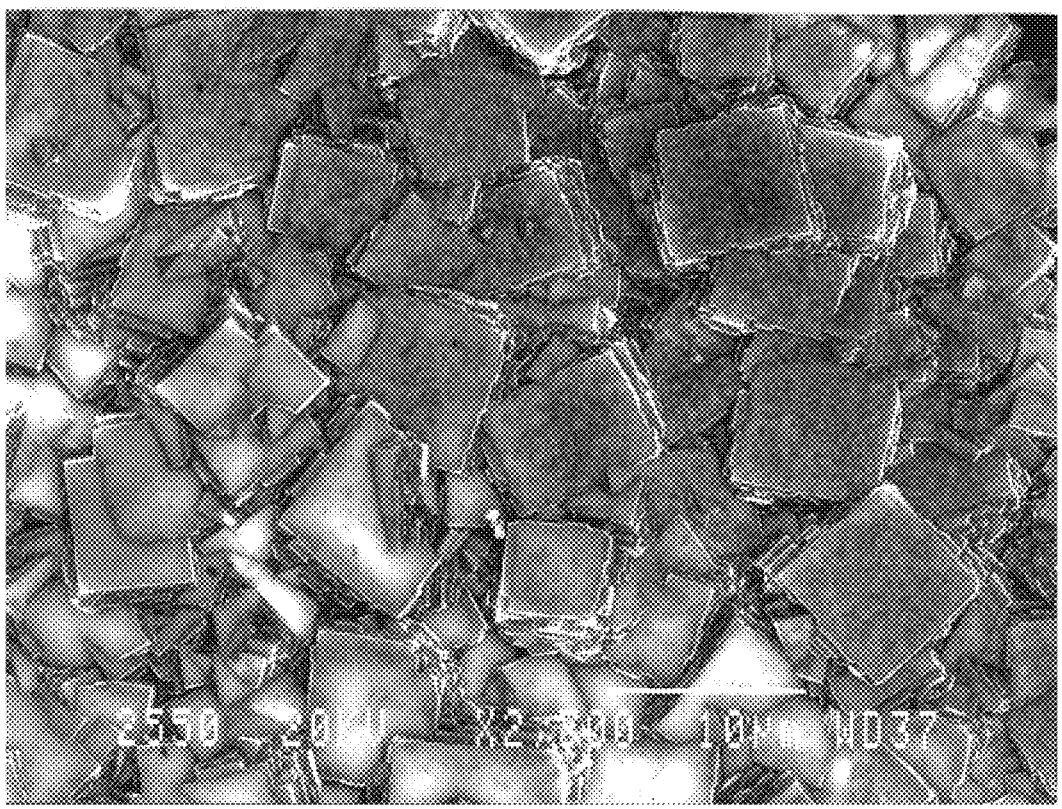
FIG. 10 is a SEM image of an oriented diamond film on (100) Si wafer.
Figure 11:
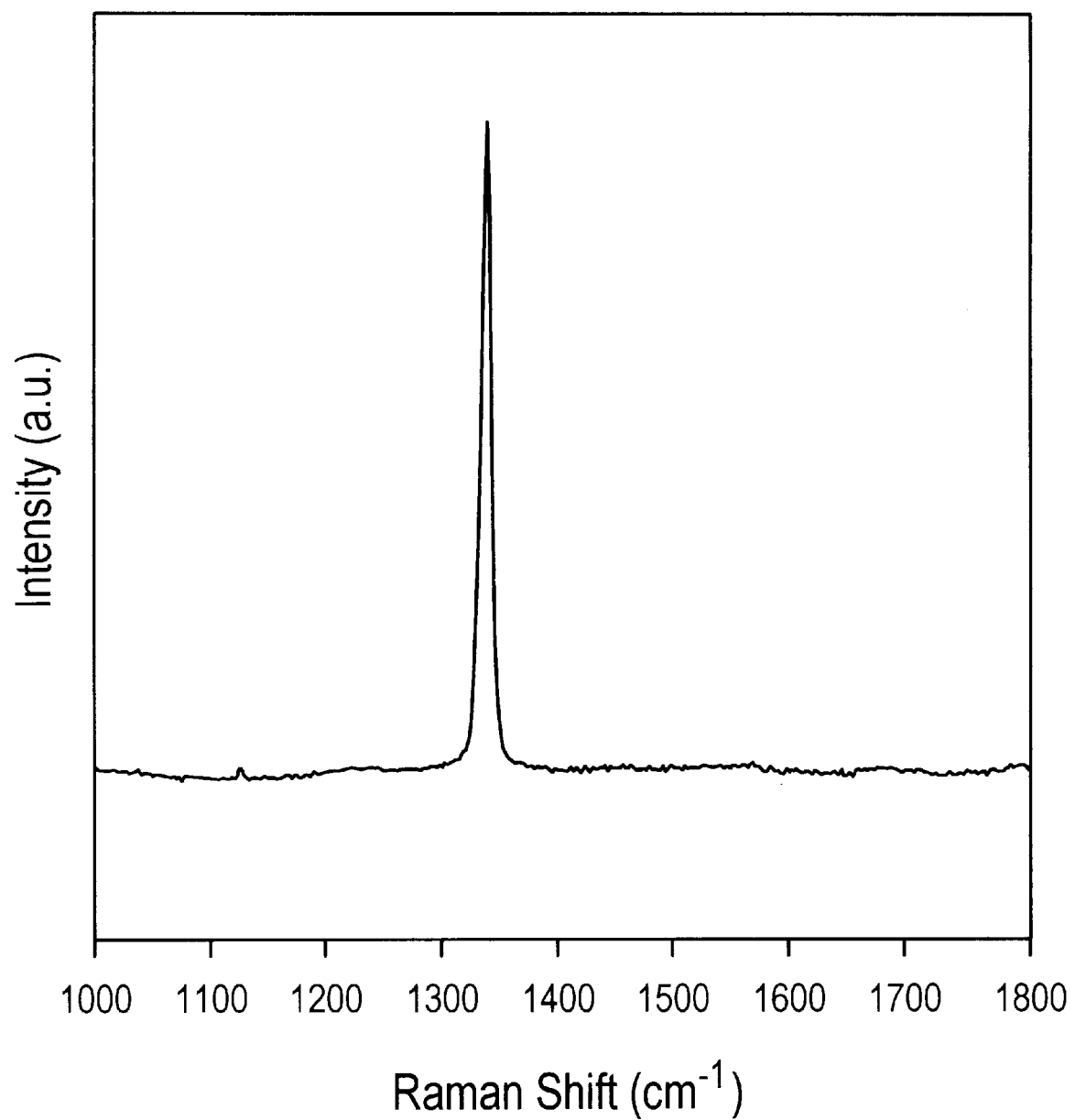
FIG. 11 is the Raman spectrum of the sample shown in FIG. 10.

FIG. 10 and FIG. 11 show respectively an oriented diamond film and its Raman spectrum. The density of oriented nucleation is higher than $10^9$/cm². The experimental parameters are as following:
ECR condition:
  Microwave power: 600 W
  Gas supply: $H_2$, 5 sccm; $CH_4$, 10 sccm
  Pressure: <10 Pa
  Time: 2 hours MPCVD growth condition:
- Microwave power: 1270 W
- Gas supply: $H_2$, 195 sccm; $CH_4$, 5 sccm
- Substrate temperature: 730° C.
- Pressure: 6000 Pa
- Duration: 12 hours

EXAMPLE 8

Figure 12:
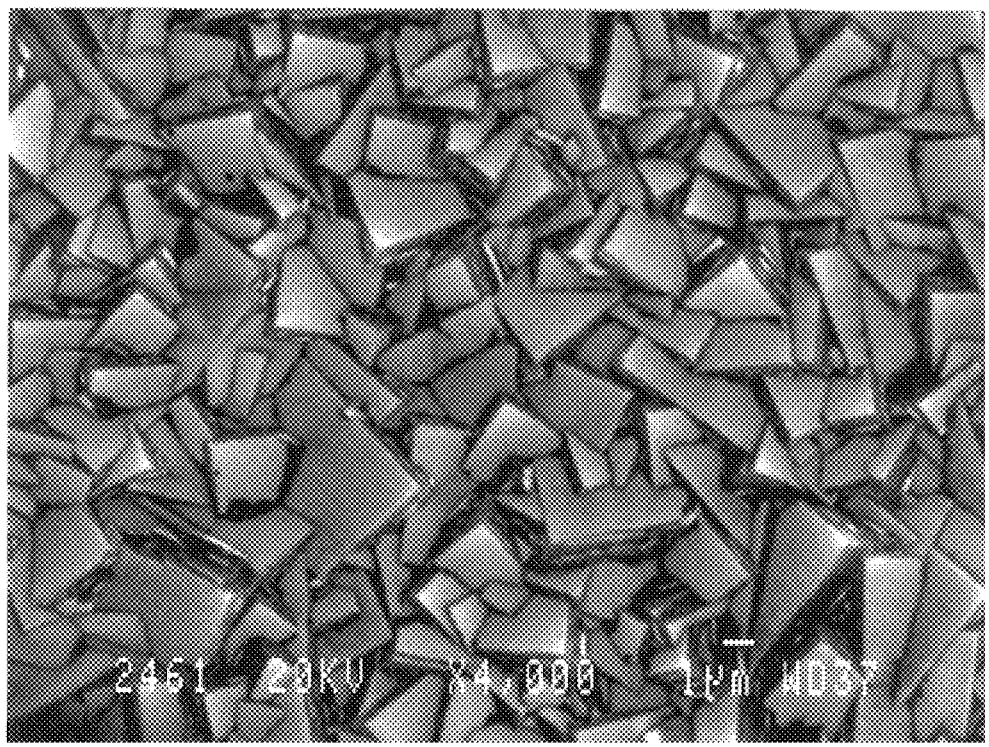
FIG. 12 is a SEM image of a large area (20×20 mm) uniform and oriented diamond film.
Figure 13:
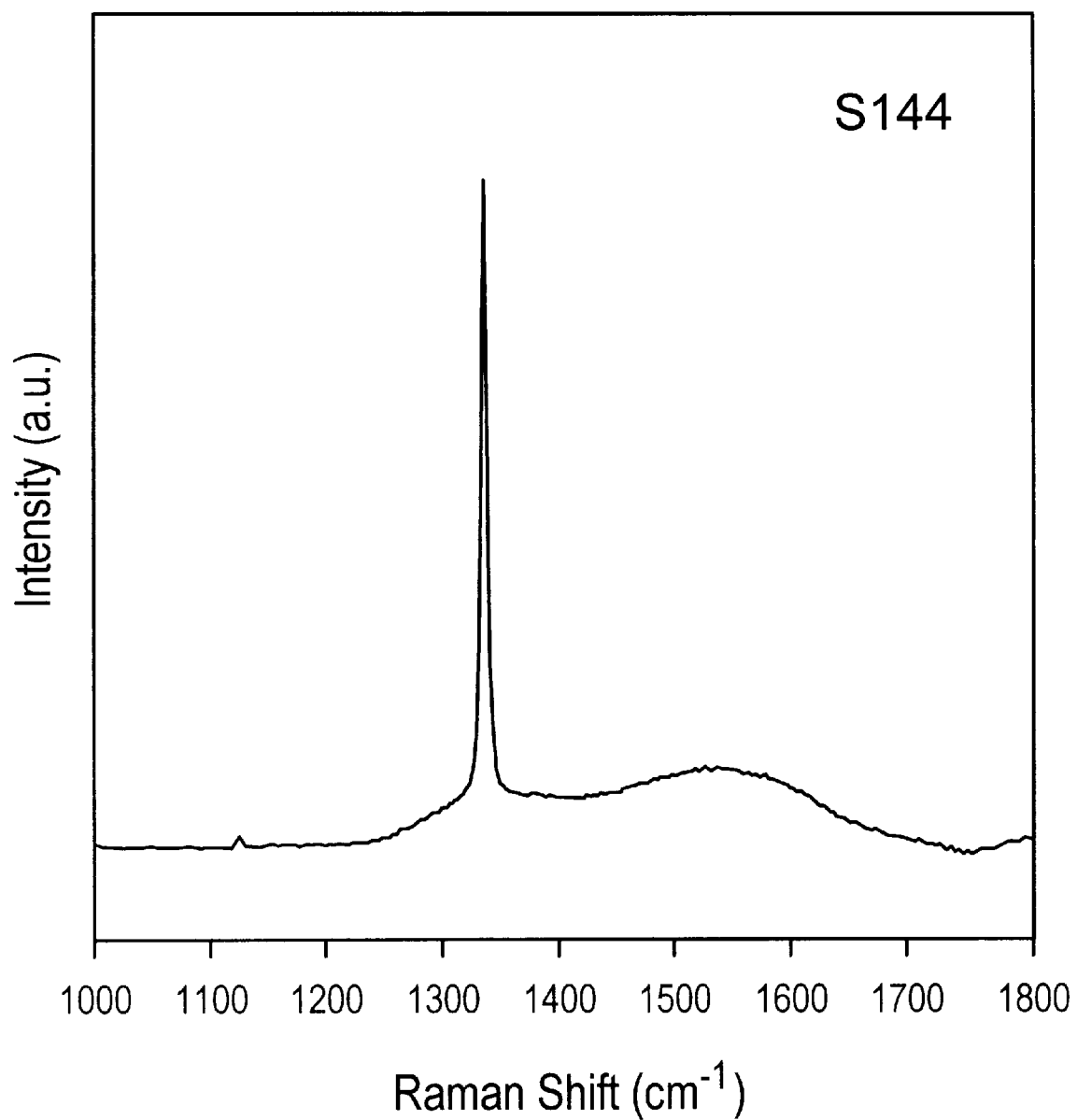
FIG. 13 is the Raman spectrum of the sample shown in FIG. 12.

FIG. 12 and FIG. 13 show respectively an oriented diamond film on a silicon wafer and its Raman spectrum. The film is uniform over an area of about 20×20 mm. The surface of substrate was pretreated by a novel method before the nucleation process. The experimental processes are as following:

Pretreatment:
- Microwave power: 200 W
- Gas supply: first CO, 10 sccm; then $H_2$, 25 sccm
- Pressure: <10 Pa
- Duration: 3 min. for CO treatment; 30 min. for $H_2$ treatment ECR condition:
- Microwave power: 700 W
- Gas supply: $H_2$, 36 sccm; $CH_4$, 6 sccm
- Pressure: <10 Pa
- Duration: 2 hours MPCVD growth condition:
- Microwave power: 1200 W
- Gas supply: $H_2$, 196 sccm; $CH_4$, 4 sccm
- Substrate temperature: 740° C.
- Pressure: 4650 Pa
- Duration: 18 hours

EXAMPLE 9

Figure 14:
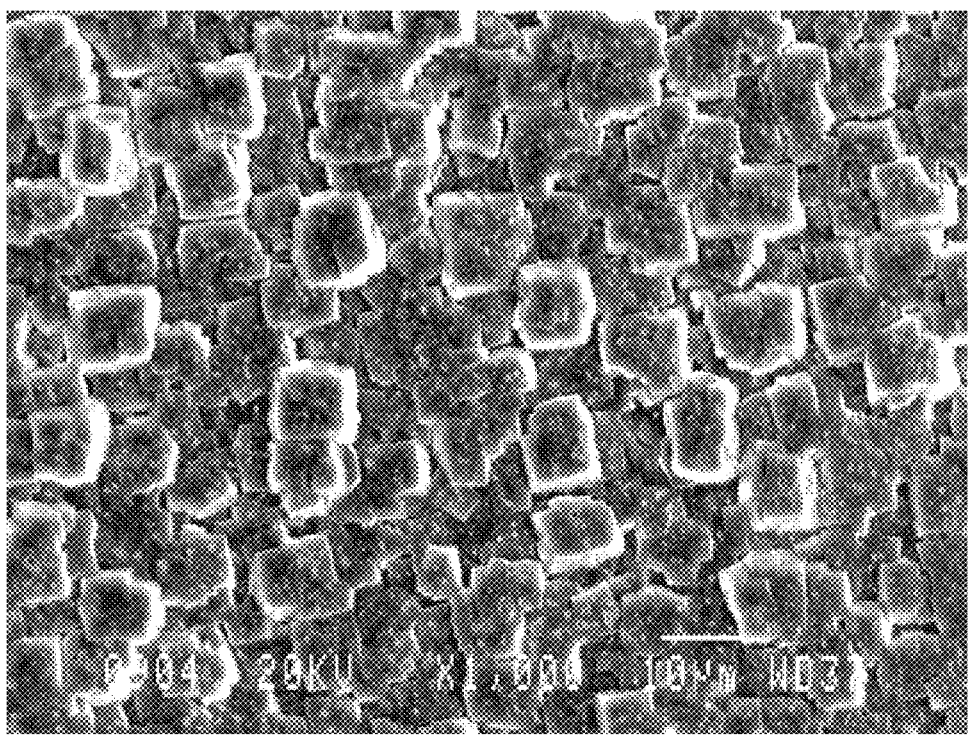
FIG. 14 is a SEM image of a highly oriented diamond film on (100) Si wafer.

FIG. 14 shows an highly oriented diamond film on a Si(100) wafer. The (100) faces of the diamond crystals are parallel to the (100) plane of the silicon substrate. The experimental parameters are as follow:

ECR condition:
- Microwave power: 700 W
- Gas supply: $H_2$, 36 sccm; $CH_4$, 6 sccm
- Pressure: <10 Pa
- Duration: 2 hours MPCVD growth condition:
- Microwave power: 1020 W
- Gas supply: $H_2$, 198 sccm; $CH_4$, 2.2 sccm
- Substrate temperature: 700° C.
- Pressure: 4130 Pa
- Duration: 14 hours Thus by means of the present invention the problems of the prior art may be overcome by using a two-step deposition method which uses an electron cyclotron resonance microwave plasma for nucleation, followed by MPCVD for subsequent growth. Both steps are incorporated and carried out in a single deposition chamber. In the nucleation step a high density of ionic species is produced by the ECR effect at a low pressure (about 1 to 10 mTorr). The chamber pressure is then increased to above 10 Torr, without breaking the vacuum, for a high growth rate deposition by the MPCVD method.

We claim:

1. A method of growing a diamond film on a silicon substrate, comprising:
   (a) etching said silicon substrate,
   (b) nucleating said substrate by means of an ECR-MP process at a first pressure, and
   (c) depositing a diamond film by means of a MPCVD process at a second pressure,
   wherein said steps (b) and (c) are carried out in a common deposition chamber without breaking the vacuum thereof between said steps (b) and (c).

2. A method as claimed in claim 1 wherein in step (b) the reactive gas is hydrogen.

3. A method as claimed in claim 1 wherein in step (b) the reactive gas is methane ($CH_4$) or other hydrocarbons mixed with hydrogen.

4. A method as claimed in claim 1 wherein in step (b) the reactive gas is CO and hydrogen.

5. A method as claimed in claim 2 wherein the reactive gas is at a pressure from 1 to 5000 Pa.

6. A method as claimed in claim 2 wherein the microwave power is 400 to 1300 W.

7. A method as claimed in claim 2 wherein the progress period is from 10 minutes to 24 hours.

8. A method as claimed in claim 1 wherein the substrate is electrically biased.

9. A method as claimed in claim 8 wherein the substate is biased at a voltage of from −30 to +30V with a current of from 0 to 200 $mAcm^{-2}$.

10. A method as claimed in claim 1 wherein the substrate is a silicon wafer heated to a temperature of from room temperature to 900° C.

11. A method as claimed in claim 1 wherein in step (c) the reactive gas is hydrogen and methane or other hydrocarbons or carbon-containing gases.

12. A method as claimed in claim 1 wherein in step (c) the reactive gas is hydrogen, methane and CO.

13. A method as claimed in claim 3 wherein the reactive gas is at a pressure from 1 to 5000 Pa.

14. A method as claimed in claim 4 wherein the reactive gas is at a pressure from 1 to 5000 Pa.

15. A method as claimed in claim 3 wherein the microwave power is 400 to 1300 W.

16. A method as claimed in claim 4 wherein the microwave power is 400 to 1300 W.

17. A method as claimed in claim 3 wherein the progress period is from 10 minutes to 24 hours.

18. A method as claimed in claim 4 wherein the progress period is from 10 minutes to 24 hours.

* * * * *